(12) United States Patent
Gonzalez

(10) Patent No.: US 9,129,847 B2
(45) Date of Patent: Sep. 8, 2015

(54) TRANSISTOR STRUCTURES AND INTEGRATED CIRCUITRY COMPRISING AN ARRAY OF TRANSISTOR STRUCTURES

(71) Applicant: Micron Technology, Inc., Boise, ID (US)

(72) Inventor: Fernando Gonzalez, Richardson, TX (US)

(73) Assignee: Micron Technology, Inc., Boise, ID (US)

(*) Notice: Subject to any disclaimer, the term of this patent is extended or adjusted under 35 U.S.C. 154(b) by 12 days.

(21) Appl. No.: 14/032,541

(22) Filed: Sep. 20, 2013

(65) Prior Publication Data

US 2014/0021550 A1 Jan. 23, 2014

Related U.S. Application Data

(63) Continuation of application No. 12/432,497, filed on Apr. 29, 2009, now Pat. No. 8,551,823, which is a continuation of application No. 11/488,384, filed on Jul. 17, 2006, now Pat. No. 7,602,001.

(51) Int. Cl.
| | |
|---|---|
| *H01L 27/108* | (2006.01) |
| *H01L 29/78* | (2006.01) |
| *H01L 21/8234* | (2006.01) |
| *H01L 21/84* | (2006.01) |
| *H01L 27/12* | (2006.01) |

(52) U.S. Cl.
CPC .... *H01L 27/10802* (2013.01); *H01L 27/10844* (2013.01); *H01L 29/7841* (2013.01); *H01L 21/823468* (2013.01); *H01L 21/84* (2013.01); *H01L 27/1203* (2013.01)

(58) Field of Classification Search
None
See application file for complete search history.

(56) References Cited

U.S. PATENT DOCUMENTS

| | | |
|---|---|---|
| 4,455,740 A | 6/1984 | Iwai |
| 4,835,741 A | 5/1989 | Baglee |
| 4,922,460 A | 5/1990 | Furutani et al. |

(Continued)

FOREIGN PATENT DOCUMENTS

| | | |
|---|---|---|
| CN | 1417853 | 5/2003 |
| CN | 20100274715.8 | 1/2013 |

(Continued)

OTHER PUBLICATIONS

Barth, "ITRS commodity memory roadmap", IEEE Xplore, Jul. 28, 2003, Abstract.

(Continued)

*Primary Examiner* — Bilkis Jahan
*Assistant Examiner* — Kevin Quinto
(74) *Attorney, Agent, or Firm* — Wells St. John, P.S.

(57) ABSTRACT

This invention includes a capacitorless one transistor DRAM cell that includes a pair of spaced source/drain regions received within semiconductive material. An electrically floating body region is disposed between the source/drain regions within the semiconductive material. A first gate spaced is apart from and capacitively coupled to the body region between the source/drain regions. A pair of opposing conductively interconnected second gates are spaced from and received laterally outward of the first gate. The second gates are spaced from and capacitively coupled to the body region laterally outward of the first gate and between the pair of source/drain regions. Methods of forming lines of capacitorless one transistor DRAM cells are disclosed.

23 Claims, 12 Drawing Sheets

(56) References Cited

U.S. PATENT DOCUMENTS

| | | |
|---|---|---|
| 4,931,409 A | 6/1990 | Nakajima et al. |
| 4,937,641 A | 6/1990 | Sunami et al. |
| 4,939,100 A | 7/1990 | Jeuch et al. |
| 4,939,793 A | 7/1990 | Stewart |
| 4,979,004 A | 12/1990 | Esquivel et al. |
| 5,013,680 A | 5/1991 | Lowrey et al. |
| 5,014,110 A | 5/1991 | Satoh |
| 5,021,355 A | 6/1991 | Dhong et al. |
| 5,047,117 A | 9/1991 | Roberts |
| 5,107,459 A | 4/1992 | Chu et al. |
| 5,108,938 A | 4/1992 | Solomon |
| 5,122,848 A | 6/1992 | Lee et al. |
| 5,160,491 A | 11/1992 | Mori |
| 5,244,824 A | 9/1993 | Sivan |
| 5,254,218 A | 10/1993 | Roberts et al. |
| 5,281,548 A | 1/1994 | Prall |
| 5,358,879 A | 10/1994 | Brady et al. |
| 5,371,024 A | 12/1994 | Hieda et al. |
| 5,376,575 A | 12/1994 | Kim et al. |
| 5,392,237 A | 2/1995 | Iida |
| 5,413,949 A | 5/1995 | Hong |
| 5,446,299 A | 8/1995 | Acovic et al. |
| 5,472,893 A | 12/1995 | Lida |
| 5,480,838 A | 1/1996 | Mitsui |
| 5,496,751 A | 3/1996 | Wei et al. |
| 5,502,320 A | 3/1996 | Yamada et al. |
| 5,504,357 A | 4/1996 | Kim et al. |
| 5,512,770 A | 4/1996 | Hong |
| 5,514,604 A | 5/1996 | Brown |
| 5,532,089 A | 7/1996 | Adair et al. |
| 5,567,634 A | 10/1996 | Hebert |
| 5,573,837 A | 11/1996 | Roberts et al. |
| 5,574,621 A | 11/1996 | Sakamoto et al. |
| 5,612,559 A | 3/1997 | Park et al. |
| 5,619,057 A | 4/1997 | Komatsu |
| 5,687,119 A | 11/1997 | Park |
| 5,693,549 A | 12/1997 | Kim |
| 5,714,412 A | 2/1998 | Liang et al. |
| 5,714,786 A | 2/1998 | Gonzalez et al. |
| 5,739,066 A | 4/1998 | Pan |
| 5,753,947 A | 5/1998 | Gonzalez |
| 5,763,305 A | 6/1998 | Chao |
| 5,792,687 A | 8/1998 | Jeng |
| 5,792,690 A | 8/1998 | Sung |
| 5,798,544 A | 8/1998 | Ohya et al. |
| 5,817,552 A | 10/1998 | Roesner et al. |
| 5,841,611 A | 11/1998 | Sakakima et al. |
| 5,869,382 A | 2/1999 | Kubota |
| 5,869,539 A | 2/1999 | Garfield et al. |
| 5,909,618 A | 6/1999 | Forbes et al. |
| 5,963,469 A | 10/1999 | Forbes |
| 5,964,750 A | 10/1999 | Tulleken et al. |
| 5,972,754 A | 10/1999 | Ni et al. |
| 5,977,579 A | 11/1999 | Noble |
| 6,005,273 A | 12/1999 | Gonzalez et al. |
| 6,015,990 A | 1/2000 | Hieda et al. |
| 6,033,963 A | 3/2000 | Huang et al. |
| 6,037,212 A | 3/2000 | Chao |
| 6,054,355 A | 4/2000 | Inumiya et al. |
| 6,059,553 A | 5/2000 | Jin et al. |
| 6,063,669 A | 5/2000 | Takashi |
| 6,072,209 A | 6/2000 | Noble et al. |
| 6,090,693 A | 7/2000 | Gonzalez et al. |
| 6,090,700 A | 7/2000 | Tseng |
| 6,096,596 A | 8/2000 | Gonzalez |
| 6,108,191 A | 8/2000 | Bruchhaus et al. |
| 6,114,735 A | 9/2000 | Batra et al. |
| 6,120,952 A | 9/2000 | Pierrat et al. |
| 6,124,611 A | 9/2000 | Mori |
| 6,127,699 A | 10/2000 | Ni et al. |
| 6,150,687 A | 11/2000 | Noble et al. |
| 6,168,996 B1 | 1/2001 | Numazawa et al. |
| 6,184,086 B1 | 2/2001 | Kao |
| 6,187,643 B1 | 2/2001 | Borland |
| 6,191,470 B1 | 2/2001 | Forbes et al. |
| 6,214,670 B1 | 4/2001 | Shih et al. |
| 6,215,149 B1 | 4/2001 | Lee et al. |
| 6,225,669 B1 | 5/2001 | Long et al. |
| 6,255,165 B1 | 7/2001 | Thurgate et al. |
| 6,258,650 B1 | 7/2001 | Sunouchi |
| 6,259,142 B1 | 7/2001 | Dawson et al. |
| 6,274,497 B1 | 8/2001 | Lou |
| 6,284,419 B2 | 9/2001 | Pierrat et al. |
| 6,297,106 B1 | 10/2001 | Pan et al. |
| 6,300,177 B1 | 10/2001 | Sundaresan et al. |
| 6,303,518 B1 | 10/2001 | Tian et al. |
| 6,306,755 B1 | 10/2001 | Zheng et al. |
| 6,319,644 B2 | 11/2001 | Pierrat et al. |
| 6,323,506 B1 | 11/2001 | Alok |
| 6,323,528 B1 | 11/2001 | Yamazaki et al. |
| 6,331,461 B1 | 12/2001 | Juengling |
| 6,337,497 B1 | 1/2002 | Hanafi et al. |
| 6,340,614 B1 | 1/2002 | Tseng |
| 6,348,385 B1 | 2/2002 | Cha et al. |
| 6,349,052 B1 | 2/2002 | Hofmann et al. |
| 6,362,506 B1 | 3/2002 | Miyai |
| 6,372,554 B1 | 4/2002 | Kawakita et al. |
| 6,383,861 B1 | 5/2002 | Gonzalez et al. |
| 6,383,879 B1 | 5/2002 | Kizilyalli et al. |
| 6,391,726 B1 | 5/2002 | Manning |
| 6,399,490 B1 | 6/2002 | Jammy et al. |
| 6,414,356 B1 | 7/2002 | Forbes et al. |
| 6,417,085 B1 | 7/2002 | Batra et al. |
| 6,420,786 B1 | 7/2002 | Gonzalez et al. |
| 6,458,653 B1 | 10/2002 | Jang |
| 6,458,925 B1 | 10/2002 | Fasano |
| 6,459,138 B2 | 10/2002 | Reinberg |
| 6,459,142 B1 | 10/2002 | Tihanyi |
| 6,473,333 B1 | 10/2002 | Tachibana et al. |
| 6,476,444 B1 | 11/2002 | Min |
| 6,495,474 B1 | 12/2002 | Rafferty et al. |
| 6,495,890 B1 | 12/2002 | Ono |
| 6,498,062 B2 | 12/2002 | Durcan et al. |
| 6,552,401 B1 | 4/2003 | Dennison |
| 6,563,183 B1 | 5/2003 | En et al. |
| 6,566,193 B2 | 5/2003 | Hofmann et al. |
| 6,573,559 B2 | 6/2003 | Kitada et al. |
| 6,586,808 B1 | 7/2003 | Xiang et al. |
| 6,624,032 B2 | 9/2003 | Alavi et al. |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,645,818 B1 | 11/2003 | Sing et al. |
| 6,645,869 B1 | 11/2003 | Chu et al. |
| 6,656,748 B2 | 12/2003 | Hall et al. |
| 6,686,616 B1 | 2/2004 | Allen et al. |
| 6,696,746 B1 | 2/2004 | Farrar et al. |
| 6,706,600 B2 | 3/2004 | Kanaya |
| 6,707,706 B2 | 3/2004 | Nitayama et al. |
| 6,717,200 B1 | 4/2004 | Schamberger et al. |
| 6,720,232 B1 | 4/2004 | Tu et al. |
| 6,724,028 B2 | 4/2004 | Gudesen |
| 6,727,137 B2 | 4/2004 | Brown |
| 6,744,097 B2 | 6/2004 | Yoo |
| 6,753,228 B2 | 6/2004 | Azam et al. |
| 6,767,789 B1 | 7/2004 | Bronner et al. |
| 6,784,112 B2 | 8/2004 | Arita et al. |
| 6,818,515 B1 | 11/2004 | Lee et al. |
| 6,818,937 B2 | 11/2004 | Noble et al. |
| 6,818,947 B2 | 11/2004 | Grebs et al. |
| 6,822,261 B2 | 11/2004 | Yamazaki et al. |
| 6,825,093 B2 | 11/2004 | Scholz |
| 6,844,230 B2 | 1/2005 | Reinberg |
| 6,844,591 B1 | 1/2005 | Tran |
| 6,849,501 B2 | 2/2005 | Rudeck |
| 6,864,536 B2 | 3/2005 | Lin et al. |
| 6,888,198 B1 | 5/2005 | Krivokapic |
| 6,888,770 B2 | 5/2005 | Ikehashi |
| 6,897,109 B2 | 5/2005 | Jin et al. |
| 6,916,711 B2 | 7/2005 | Yoo |
| 6,924,190 B2 | 8/2005 | Dennison |
| 6,930,640 B2 | 8/2005 | Chung et al. |
| 6,939,763 B2 | 9/2005 | Schlosser et al. |
| 6,969,662 B2 | 11/2005 | Fazan et al. |

(56) References Cited

U.S. PATENT DOCUMENTS

| | | |
|---|---|---|
| 6,979,853 B2 | 12/2005 | Sommer et al. |
| 7,005,349 B2 | 2/2006 | Lee et al. |
| 7,005,710 B1 | 2/2006 | Gonzalez et al. |
| 7,015,543 B2 | 3/2006 | Kawamura et al. |
| 7,022,573 B2 | 4/2006 | Hsiao et al. |
| 7,027,334 B2 | 4/2006 | Ikehashi |
| 7,030,436 B2 | 4/2006 | Forbes |
| 7,042,009 B2 | 5/2006 | Shaheen et al. |
| 7,049,196 B2 | 5/2006 | Noble |
| 7,071,043 B2 | 7/2006 | Tang et al. |
| 7,075,151 B2 | 7/2006 | Shino |
| 7,084,028 B2 | 8/2006 | Fukuzumi |
| 7,087,956 B2 | 8/2006 | Umebayashi |
| 7,091,092 B2 | 8/2006 | Sneelal et al. |
| 7,122,425 B2 | 10/2006 | Chance et al. |
| 7,122,449 B2 | 10/2006 | Langdo et al. |
| 7,125,774 B2 | 10/2006 | Kim et al. |
| 7,125,781 B2 | 10/2006 | Manning et al. |
| 7,135,371 B2 | 11/2006 | Han et al. |
| 7,148,527 B2 | 12/2006 | Kim et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,214,621 B2 | 5/2007 | Nejad et al. |
| 7,244,659 B2 | 7/2007 | Tang et al. |
| 7,250,650 B2 | 7/2007 | Hierlemann et al. |
| 7,262,089 B2 | 8/2007 | Abbott et al. |
| 7,282,401 B2 | 10/2007 | Juengling |
| 7,285,812 B2 | 10/2007 | Tang et al. |
| 7,319,255 B2 | 1/2008 | Hwang et al. |
| 7,349,232 B2 | 3/2008 | Wang et al. |
| 7,351,666 B2 | 4/2008 | Furukawa et al. |
| 7,361,545 B2 | 4/2008 | Li et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,494,870 B2 | 2/2009 | Chien et al. |
| 7,495,294 B2 | 2/2009 | Higashitani |
| 7,495,946 B2 | 2/2009 | Schwerin et al. |
| 7,504,686 B2 | 3/2009 | Lutze et al. |
| 7,528,440 B2 | 5/2009 | Forbes |
| 7,535,745 B2 | 5/2009 | Shuto |
| 7,547,640 B2 | 6/2009 | Abatchev et al. |
| 7,547,945 B2 | 6/2009 | Tang et al. |
| 7,560,390 B2 | 7/2009 | Sant et al. |
| 7,564,087 B2 | 7/2009 | Forbes |
| 7,567,087 B2 | 7/2009 | Yamakami et al. |
| 7,567,452 B2 | 7/2009 | Song et al. |
| 7,576,389 B2 | 8/2009 | Tanaka |
| 7,589,995 B2 | 9/2009 | Tang et al. |
| 7,602,001 B2 * | 10/2009 | Gonzalez ............... 257/296 |
| 7,605,090 B2 | 10/2009 | Gutsche et al. |
| 7,608,503 B2 | 10/2009 | Lung et al. |
| 7,608,876 B2 | 10/2009 | Forbes |
| 7,619,311 B2 | 11/2009 | Lung |
| 7,648,919 B2 | 1/2010 | Tran et al. |
| 7,684,245 B2 | 3/2010 | Schumann et al. |
| 7,700,441 B2 | 4/2010 | Kim et al. |
| 7,732,275 B2 | 6/2010 | Orimoto et al. |
| 8,084,190 B2 | 12/2011 | Gutsche et al. |
| 2001/0002304 A1 | 5/2001 | Pierrat et al. |
| 2001/0017390 A1 | 8/2001 | Long et al. |
| 2001/0023045 A1 | 9/2001 | Pierrat et al. |
| 2001/0025973 A1 | 10/2001 | Yamada et al. |
| 2001/0038123 A1 | 11/2001 | Yu |
| 2001/0044181 A1 | 11/2001 | Nakamura |
| 2001/0052617 A1 | 12/2001 | Kitada et al. |
| 2002/0022339 A1 | 2/2002 | Kirchhoff |
| 2002/0127796 A1 | 9/2002 | Hofmann et al. |
| 2002/0127798 A1 | 9/2002 | Prall |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Cleventer et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0082863 A1 | 5/2003 | Lim et al. |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0168677 A1 | 9/2003 | Hsu |
| 2003/0169629 A1 | 9/2003 | Goebel et al. |
| 2003/0170955 A1 | 9/2003 | Kawamura et al. |
| 2003/0234414 A1 | 12/2003 | Brown |
| 2004/0009644 A1 | 1/2004 | Suzuki |
| 2004/0018679 A1 | 1/2004 | Yu et al. |
| 2004/0034587 A1 | 2/2004 | Amberson et al. |
| 2004/0061148 A1 | 4/2004 | Hsu |
| 2004/0065919 A1 | 4/2004 | Wilson et al. |
| 2004/0070028 A1 | 4/2004 | Azam et al. |
| 2004/0092115 A1 | 5/2004 | Hsieh et al. |
| 2004/0125636 A1 | 7/2004 | Kurjanowicz et al. |
| 2004/0150070 A1 | 8/2004 | Okada et al. |
| 2004/0159857 A1 | 8/2004 | Horita et al. |
| 2004/0184298 A1 | 9/2004 | Takahashi et al. |
| 2004/0188738 A1 | 9/2004 | Farnworth et al. |
| 2004/0197995 A1 | 10/2004 | Lee et al. |
| 2004/0222458 A1 | 11/2004 | Hsieh et al. |
| 2004/0224476 A1 | 11/2004 | Yamada et al. |
| 2004/0232466 A1 | 11/2004 | Birner et al. |
| 2004/0259311 A1 | 12/2004 | Kim et al. |
| 2004/0266081 A1 | 12/2004 | Oh et al. |
| 2005/0017240 A1 | 1/2005 | Fazan |
| 2005/0042833 A1 | 2/2005 | Park et al. |
| 2005/0063224 A1 | 3/2005 | Fazan et al. |
| 2005/0066892 A1 | 3/2005 | Dip et al. |
| 2005/0104156 A1 | 5/2005 | Wasshuber |
| 2005/0106820 A1 | 5/2005 | Tran |
| 2005/0106838 A1 | 5/2005 | Lim et al. |
| 2005/0124130 A1 | 6/2005 | Mathew et al. |
| 2005/0136616 A1 | 6/2005 | Cho et al. |
| 2005/0167751 A1 | 8/2005 | Nakajima et al. |
| 2005/0275014 A1 | 12/2005 | Kim |
| 2005/0275042 A1 | 12/2005 | Hwang et al. |
| 2005/0287780 A1 | 12/2005 | Manning et al. |
| 2006/0043449 A1 | 3/2006 | Tang et al. |
| 2006/0046407 A1 | 3/2006 | Juengling |
| 2006/0046424 A1 | 3/2006 | Chance et al. |
| 2006/0083058 A1 | 4/2006 | Ohsawa |
| 2006/0113588 A1 | 6/2006 | Wu |
| 2006/0167741 A1 | 7/2006 | Erickson et al. |
| 2006/0194410 A1 | 8/2006 | Sugaya |
| 2006/0204898 A1 | 9/2006 | Gutsche et al. |
| 2006/0216894 A1 | 9/2006 | Parekh et al. |
| 2006/0216922 A1 | 9/2006 | Tran et al. |
| 2006/0261393 A1 | 11/2006 | Tang et al. |
| 2006/0264001 A1 | 11/2006 | Tran et al. |
| 2006/0281254 A1* | 12/2006 | Lee et al. ............... 438/257 |
| 2007/0001222 A1 | 1/2007 | Orlowski et al. |
| 2007/0045712 A1 | 3/2007 | Haller et al. |
| 2007/0048941 A1 | 3/2007 | Tang et al. |
| 2007/0048942 A1 | 3/2007 | Hanson et al. |
| 2007/0051997 A1 | 3/2007 | Haller et al. |
| 2007/0096204 A1 | 5/2007 | Shiratake |
| 2007/0117310 A1 | 5/2007 | Bai et al. |
| 2007/0128856 A1 | 6/2007 | Tran et al. |
| 2007/0138526 A1 | 6/2007 | Tran et al. |
| 2007/0148984 A1 | 6/2007 | Abatchev et al. |
| 2007/0158719 A1 | 7/2007 | Wang |
| 2007/0166920 A1 | 7/2007 | Tang et al. |
| 2007/0178641 A1 | 8/2007 | Kim et al. |
| 2007/0238299 A1 | 10/2007 | Niroomand et al. |

(56) References Cited

U.S. PATENT DOCUMENTS

| | | |
|---|---|---|
| 2007/0238308 A1 | 10/2007 | Niroomand et al. |
| 2007/0261016 A1 | 11/2007 | Sandhu et al. |
| 2008/0012056 A1 | 1/2008 | Gonzalez |
| 2008/0012070 A1 | 1/2008 | Juengling |
| 2008/0042179 A1 | 2/2008 | Haller et al. |
| 2008/0061346 A1 | 3/2008 | Tang et al. |
| 2008/0099847 A1 | 5/2008 | Tang et al. |
| 2008/0142882 A1 | 6/2008 | Tang et al. |
| 2008/0166856 A1 | 7/2008 | Parekh et al. |
| 2008/0299774 A1 | 12/2008 | Sandhu et al. |
| 2008/0311719 A1 | 12/2008 | Tang et al. |
| 2009/0035665 A1 | 2/2009 | Tran |
| 2009/0173994 A1 | 7/2009 | Min et al. |
| 2009/0311845 A1 | 12/2009 | Tang et al. |
| 2010/0006983 A1 | 1/2010 | Gutsche et al. |
| 2012/0009772 A1 | 1/2012 | Mathew et al. |

FOREIGN PATENT DOCUMENTS

| | | |
|---|---|---|
| DE | 204408764 | 9/1994 |
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| EP | 1696477 | 9/2009 |
| EP | 1125167 | 5/2010 |
| EP | 100114743 | 7/2011 |
| EP | 14001506 | 11/2014 |
| JP | 51-147280 | 12/1976 |
| JP | 58-220464 | 12/1983 |
| JP | 2002172 | 1/1990 |
| JP | 03-219677 | 9/1991 |
| JP | H04-14253 | 1/1992 |
| JP | 07-078977 | 3/1995 |
| JP | 07-106435 | 4/1995 |
| JP | 07-297297 | 11/1995 |
| JP | 09-129837 | 5/1997 |
| JP | 11-274478 | 10/1999 |
| JP | 2000-208762 | 7/2000 |
| JP | 2001-024161 | 1/2001 |
| JP | 2002-151654 | 5/2002 |
| JP | 2002-184958 | 6/2002 |
| JP | 2003-017585 | 1/2003 |
| JP | 2004-071935 | 3/2004 |
| JP | 2004-0247656 | 9/2004 |
| JP | 2005-142203 | 6/2005 |
| JP | 2005-175090 | 6/2005 |
| JP | 2005-093808 | 7/2005 |
| JP | 2005-354069 | 12/2005 |
| JP | 2005-277430 | 6/2006 |
| KR | 19930006930 | 4/1993 |
| KR | 19940006679 | 4/1994 |
| KR | 10-2004-0109280 | 10/2006 |
| KR | 10-0640616 | 10/2006 |
| TW | 498332 | 8/2002 |
| TW | 574746 | 2/2004 |
| TW | 428308 | 4/2004 |
| TW | 200411832 | 7/2004 |
| TW | I231042 | 4/2005 |
| TW | I235479 | 7/2005 |
| TW | 200617957 | 6/2006 |
| TW | 096128462 | 6/2011 |
| WO | WO 86/03341 | 6/1986 |
| WO | WO 97/44826 | 11/1997 |
| WO | WO 99/36961 | 7/1999 |
| WO | WO 00/19272 | 4/2000 |
| WO | WO 02/089182 | 11/2002 |
| WO | PCT/US2004/027898 | 2/2005 |
| WO | WO 2005/083770 | 9/2005 |
| WO | PCT/US2006/006806 | 7/2006 |
| WO | PCT/US2006/008295 | 7/2006 |
| WO | PCT/US2006/008295 | 9/2006 |
| WO | PCT/US2004/034587 | 10/2006 |
| WO | PCT/US2005/030668 | 10/2006 |
| WO | PCT/US2006/031555 | 12/2006 |
| WO | PCT/US2006/006806 | 2/2007 |
| WO | PCT/US2006/008295 | 5/2007 |
| WO | WO 2007/058840 | 5/2007 |
| WO | PCT/US2006/006806 | 9/2007 |
| WO | PCT/US2007/001953 | 9/2007 |
| WO | PCT/US2007/014689 | 1/2008 |
| WO | PCT/US2007/016573 | 1/2008 |
| WO | PCT/US2007/014689 | 4/2008 |
| WO | PCT/US2007/023767 | 5/2008 |
| WO | PCT/US2007/001953 | 8/2008 |
| WO | PCT/US2007/019592 | 11/2008 |
| WO | PCT/US2007/014689 | 1/2009 |
| WO | PCT/US2007/016573 | 2/2009 |
| WO | PCT/US2007/019592 | 3/2009 |
| WO | US/2007/023767 | 5/2009 |
| WO | PCT/US2006/031555 | 10/2011 |

OTHER PUBLICATIONS

Bashir et al,. "Characterization of sidewall defects in selective epitaxial growth of silicon", American Vaccum Society, May/Jun. 1995, pp. 923-927.

Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.

Bernstein et al., Chapter 3, 3.4-3.5, SOI Device Electrical Properties, Jan. 2000; pp. 34-53.

Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.

Chen et al., "The Enhancement of Gate-Induced-Drain-Leakage (GIDL) Current in Short-Channel SOI MOSTFET and its Application in . . . ", IEEE Electron Device Letters, vol. 13, No. 11, pp. 572-574 (Nov. 1992)

Choi et al., "Investigation of Gate-Induced Drain Leakage (GIDL) Current in Thin Body Devices: Single-Gate Ultra-thin Body, Symmetrical Double-Gate, and . . . ", JPN. J. Appl. Phys., vol. 42, pp. 2073-2076 (2003).

Clarke, "Device Structures Architectures compatible with conventional silicon processes—Vertical transistors plumbed for memory, logic", Electronic Engineering Times, p. 24, Feb. 14, 2000.

Fazan et al., "MOSFET design simplifies DRAM", EE Times, May 13, 2002, 7 pgs.

Gonzalez et al., "A dynamic source-drain extension MOSFET using a separately biased conductive spacer", Solid-State Electronics, vol. 46. pp. 1525-1530 (2002).

Hammed et al., "The Pseudo-Two-Dimensional Approach to Model the Drain Section in SOI MOSFETs", 2001 IEEE Transactions on Electron Devices, vol. 48, No. 2, Feb. 2001, pp. 386-387.

Hara, "Toshiba cuts capacitor from DRAM cell design", EE Times, http://www.us.design-reuse.com/news/news24,html, Feb. 7, 2002, 2 pgs.

Henkels et al., "Large-Signal 2T, 1C DRAM Cell: Signal and Layout Analysis", 1994 IEEE Journal of Solid-State Circuits, Jul. 29, 1994, No. 7, pp. 829-832.

Invitation to Pay Additional Fees, date of mailing Jan. 14, 2008, including documents considered to be relevant, pp. 1-10, PCT/US2007/014689.

Keast, et al., "Silicon Contact Formation and Photoresist Planarization Using Chemical Mechanical Polishing", 1994 ISMIC, Jun. 7-8, 1994 VMIC Conference, pp. 204-205.

Kim et al., "The Breakthrough in data retention time of DRAM using Recess-Channel-Array Transistor (RCAT) for 88nm feature size and beyond", 2003 Symposium on VLSI Technology Digest of Technical Papers, 2 pages.

Kim H.S. et al., "An Outstanding and Highly Manufacturable 80nm DRAM Technology", 2003 IEEE, 4 pages.

(56) References Cited

OTHER PUBLICATIONS

Kraynik, "Foam Structure: from soap froth to solid foams", MRS Bulletin, Apr. 2003, pp. 275-278.
Kuo et al., "A capacitorless double-gate DRAM cell design for high density applications", IEEE, IEDM, pp. 843-846 (2002).
Lammers, "Bell Labs opens gate to deeper-submicron CMOS", Electronic Engineering Times, Dec. 6, 1999, p. 18
Liu, "Dual-Work-Function Metal Gates by Full Silicidation of Poly-Si with Co—Ni Bi-Layers", 2005 IEEE, vol. 26, No. 4, Apr. 2005, pp. 228-230.
Lusky et al., "Investigation of channel hot electron injection by localized charge-trapping nonvolatile memory devices", IEEE Transactions on Electron Devices, vol. 51, No. 3, pp. 444-451 (Mar. 2004).
Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.
Minami et al., "A Floating Body Cell (FBC) Fully Compatible with 90 nm CMOS Technology (CMOS4) for 128Mb SOI DRAM", 2005 IEDM Technical Program, 2005, pp. 13.1.1-13.1.4.
Minami et al., "A high speed and high reliability MOSFET utilizing an auxiliary gate", 1990 Symposium on VLSI Technology, IEEE, pp. 41-42 (1990).
Mo et al., "Formation and Properties of ternary silicide (CoxNi1-x) Sit thin films", 1998 IEEE, pp. 271-274.
Rancia et al., "A One Transistor Cell on Bulk Substrate (1T-Bulk) for Low-Cost & High Density eDRAM", VLSI Technology, 2004, IEEE, Jun. 15, 2004, pp. 128-129.
Risch et al., "Vertical MOS Transistors with 70nm Channel Length", 1996 IEEE vol. 43, No. 9, Sep. 1996, pp. 1495-1498.
Sivagnaname et al "Stand-by Current in PD-SOI Pseudo-nMOS Circuits", 2003 IEEE, pp. 95-96.
Sunouchi et al., "Double LDD concave (DLC) structure for sub-half Micron MOSFET", IEEE, IEDM, pp. 226-228 (1988).
Tanaka et al., "Scalability study on a capacitorless 1T-Dram: from single-gate PD-SOI to double-gate FinDRAM", IEDM Technical Digest, IEEE international Electron Devices Meeting, Dec. 13-15, 2004, pp. 37.5-1.37.5.4.
Tiwari et al., "Straddle Gate Transistors: High Ion/Ioff Transistors at Short Gate Lengths", IBM Research Article, pp. 26-27 (pre-Mar. 2006).
Villaret et al.,"Mechanisms of charge modulation in the floating body of triple-well nMOSFET capacitor-less DRAMs", vol. 72 (1-4), Elsevier Publishers B.V., Apr. 2004, pp. 434-439.
Wang et al., "Achieving Low junction capacitance on buik Si MOSFET using SDOI process", Micron Technology, Inc., 12 pages.
Yasaitis et al., "A modular process for integrating thick polysilicon MEMS devices with submicron CMOS", Analog Devices. Pre-2004.
Yoshida et al., "A capacitorless 1T-DRAM Technology Using Gate-Induced Drain-Leakage (GIDL) Current for Low-Power and High-Speed . . . ", IEEE Transactions on Electron Devices, vol. 53, No. 4, pp. 692-697 (Apr. 2006).
Yoshida et al., "A design of a capacitorless 1T-DRAM cell using gate-induced drain leakage (GIDL) current for low-power and high-speed embedded memory", IEEE International Electron Devices Meeting, 2003, IEDM '03 Technical Digest, Dec. 8-10, 2003, pp. 37.6.1-37.6.4.
PCT/US2007/014689, "Invitation to Pay Additional Fees", Date of Mailing Jan. 14, 2008, pp, 1-10.

\* cited by examiner

9,129,847 B2

TRANSISTOR STRUCTURES AND INTEGRATED CIRCUITRY COMPRISING AN ARRAY OF TRANSISTOR STRUCTURES

RELATED PATENT DATA

This patent resulted from a continuation application of U.S. patent application Ser. No. 12/432,497, filed Apr. 29, 2009, entitled "Methods Of Forming Lines Of Capacitorless One Transistor DRAM Cells, Methods Of Patterning Substrates, And Methods Of Forming Two Conductive Lines", naming Fernando Gonzalez as inventor, which is a continuation application of U.S. patent application Ser. No. 11/488,384, filed Jul. 17, 2006, now U.S. Pat. No. 7,602,001, entitled "Capacitorless One Transistor DRAM Cell, Integrated Circuitry Comprising an Array of Capacitorless One Transistor DRAM Cells, and Method of Forming Lines of Capacitorless One Transistor DRAM Cells", naming Fernando Gonzalez as inventor, and the disclosures of which are incorporated by reference.

TECHNICAL FIELD

This invention relates to capacitorless one transistor DRAM cells, to integrated circuitry comprising an array of capacitorless one transistor DRAM cells, and to methods of forming lines of capacitorless one transistor DRAM cells.

BACKGROUND OF THE INVENTION

Semiconductor memories, such as dynamic random access memory (DRAMs), are widely used in computer systems for storing data. A DRAM cell typically includes an access field effect transistor (FET) and a storage capacitor. The access FET allows the transfer of data charges to and from the storage capacitor during reading and writing operations. Data charges on the storage capacitor are periodically refreshed during a refresh operation.

Capacitorless one transistor DRAM cells have also been developed. One type of such cell utilizes a floating body effect of a semiconductor-on-insulator transistor, for example as disclosed in U.S. Pat. No. 6,969,662. Such memory cell might comprise a partially depleted or a fully depleted silicon-on-insulator transistor (or transistor formed in bulk substrate material) having a channel which is disposed adjacent to the body and separated therefrom by a gate dielectric. The body region of the transistor is electrically floating in view of insulation or a non-conductive region disposed beneath the body region. The state of the memory cell is determined by the concentration of charge within the body region of the semiconductor-on-insulator transistor.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The discussion proceeds initially with exemplary methods of forming a line of capacitorless one transistor DRAM cells. Aspects of the invention also include capacitorless one transistor DRAM cells, and integrated circuitry comprising an array of capacitorless one transistor DRAM cells, independent of the method of manufacture.

Figure 1:
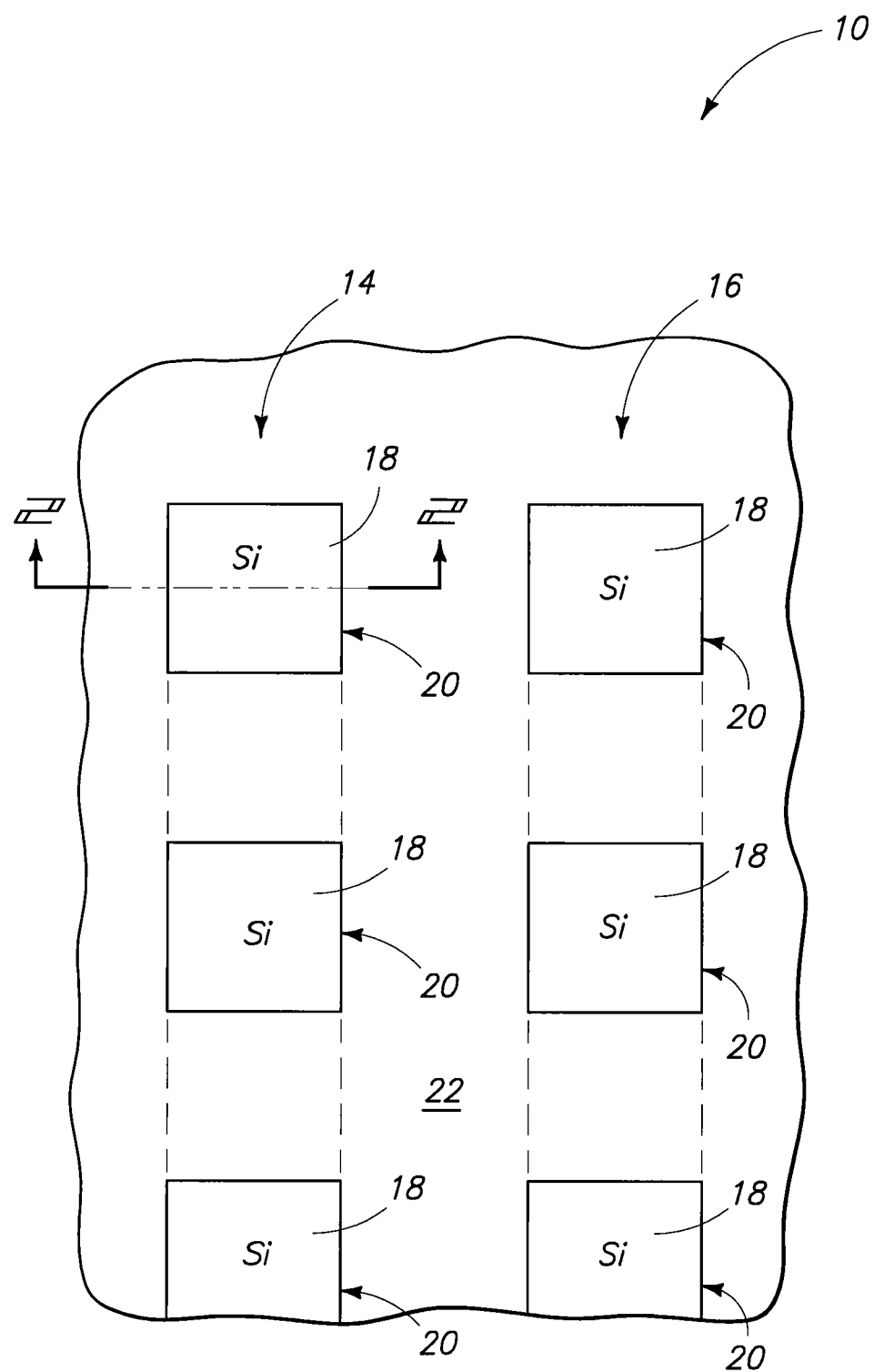
FIG. 1 is a diagrammatic top plan view of a semiconductor substrate in process in accordance with an aspect of the invention.
Figure 2:
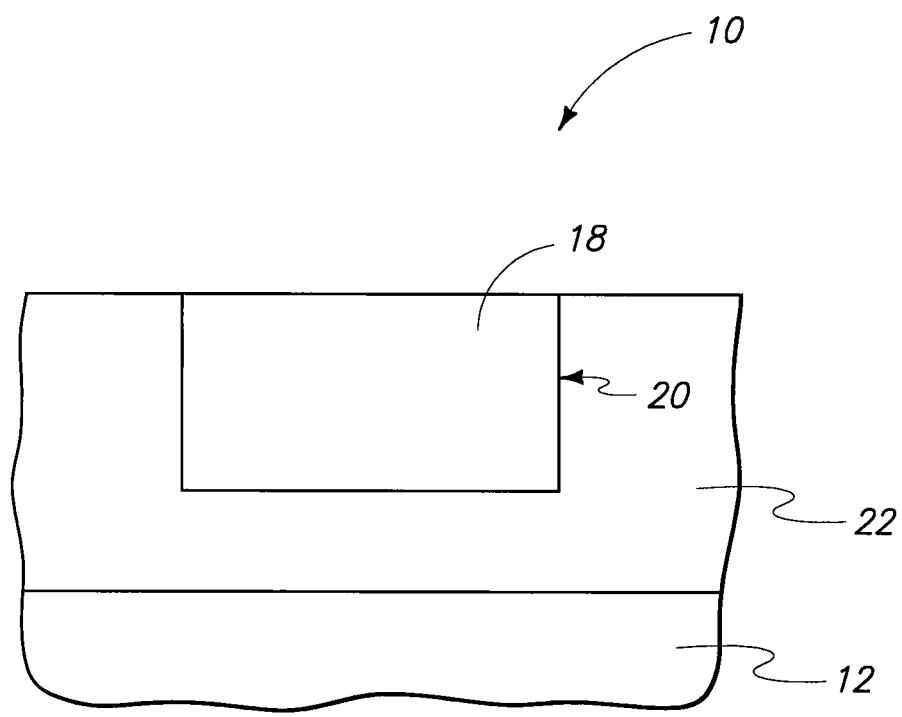
FIG. 2 is a diagrammatic section view taken through line 2-2 in FIG. 1.

Referring to FIGS. 1 and 2, a substrate (preferably a semiconductor substrate) is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a base substrate 12, for example bulk monocrystalline silicon. However, substrate 10 might comprise another substrate, whether existing or yet-to-be developed, and for example comprise a semiconductor-on-insulator substrate.

Substrate 10 is formed to comprise exemplary lines 14, 16 of spaced islands 20 of semiconductive material 18. Lines 14, 16 are shown as being essentially straight linear, although curved, jagged, angled or other shaped lines are of course contemplated. An exemplary preferred semiconductive material 18 is monocrystalline silicon, for example fabricated of exemplary bulk semiconductor substrate material 12. By way of example only, an exemplary manner of forming depicted islands 20 is by existing or yet-to-be developed trench and refill techniques of forming insulative material 22 laterally about islands 20. An exemplary preferred material includes one or a combination of silicon dioxide and/or silicon nitride. Insulative material 22 elevationally beneath islands 20 can be fabricated, for example, by ion implanting oxygen atoms into bulk substrate material 12 to a peak implant depth immediately beneath islands 20, and forming silicon dioxide therefrom. Alternately by way of example only and although less preferred, insulative material 22 might be deposited, island openings 20 etched therein, and which are subsequently filled with a semiconductive material, for example monocrystalline and/or polycrystalline silicon. Further alternately, of course, one or more techniques could be utilized whereby laterally opposing trenches are made into semiconductor substrate 12, followed by laterally undercut etching beneath islands 20, and wherein the undercut volume is subsequently filled with one or more insulative materials. Regardless, in one exemplary implementation insulative material 22 can be considered as received laterally about and beneath respective islands 20, and contacting semiconductive material 18 of such islands. The discussion proceeds for ease of description relative to a method of forming a line of capacitorless one transistor DRAM cells relative to line 14 of spaced islands 20 of semiconductive material 18.

Figure 3:
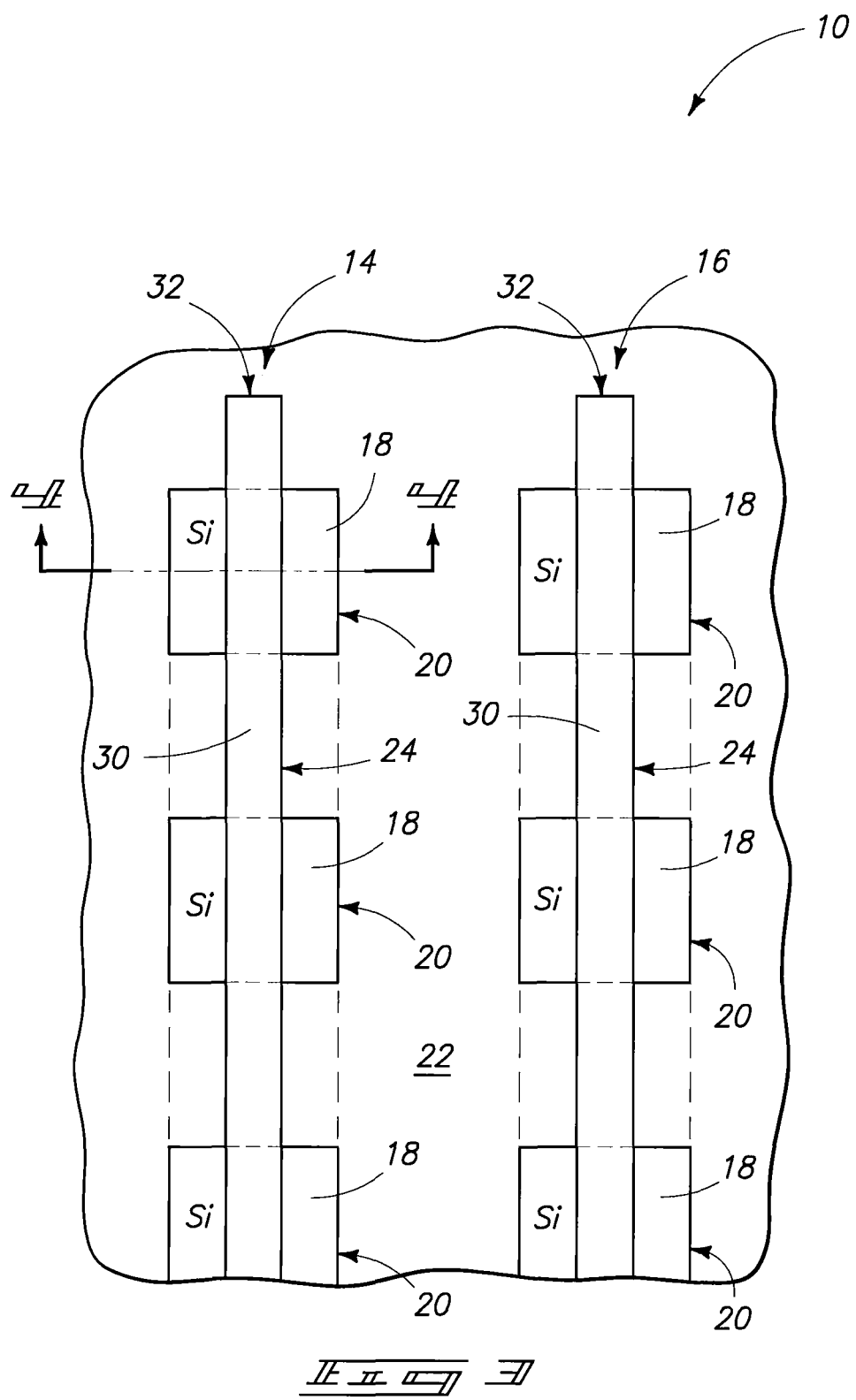
FIG. 3 is a view of the FIG. 1 substrate at a processing step subsequent to that shown by FIG. 1.
Figure 4:
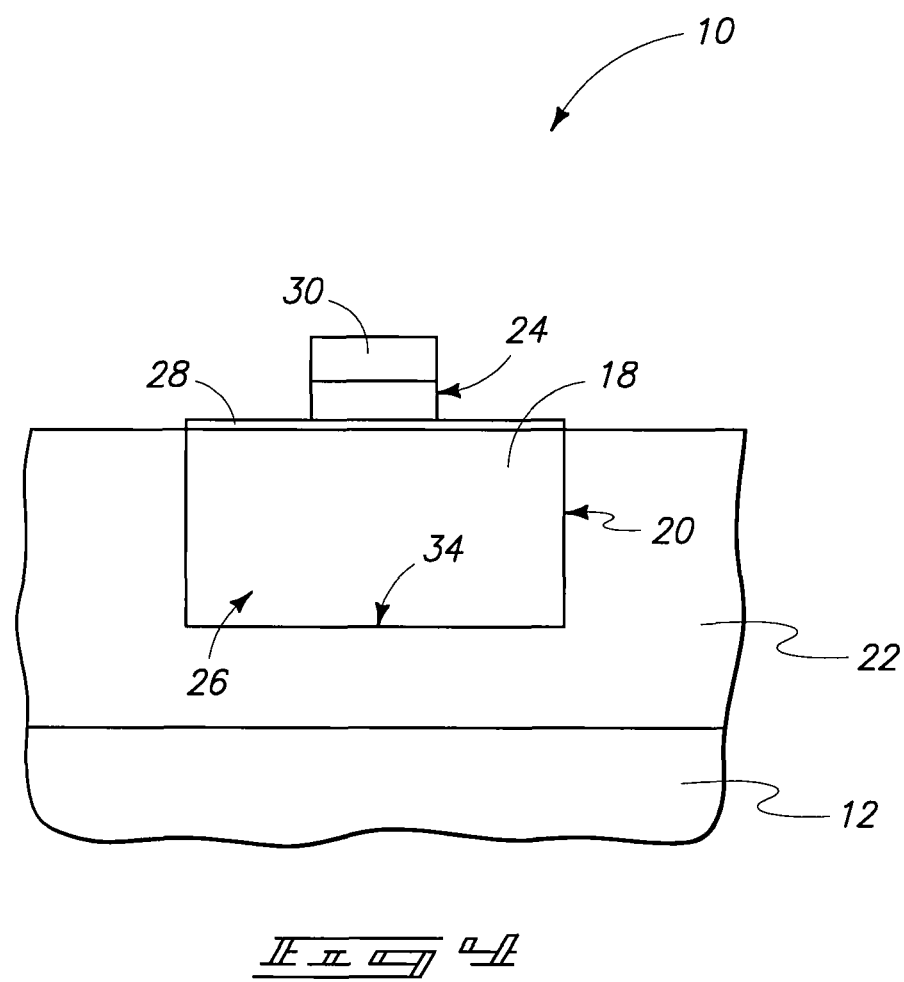
FIG. 4 is a diagrammatic section view taken through line 4-4 in FIG. 3.

Referring to FIGS. 3 and 4, a word line 24 is formed, which is common to and extends over line 14 of spaced islands 20. Word line 24 is formed over a floating body region 26 of the respective spaced islands 20. Word line 24 is spaced apart from and capacitively coupled to body region 26, for example by/through exemplary depicted dielectric layer 28. Such might comprise any suitable dielectric, with silicon dioxide thermally grown from preferred silicon semiconductive material 18 being but one example. An exemplary preferred thickness range for material(s) 28 is from 12 Angstroms to 100 Angstroms. Further by way of example only, an exemplary preferred depth for material 18 is from 500 Angstroms to 1,000 Angstroms. Word line 24 preferably comprises any one or combination of refractory metals, refractory metal silicides, and/or conductively doped semiconductive materials such as polycrystalline silicon. An insulative cap 30 is received over word line 24, with silicon nitride and/or silicon dioxide being exemplary materials. For purposes of the continuing discussion, word line 24 can be considered as comprising an end 32 in the exemplary FIG. 3 depiction. For purposes of the continuing discussion, floating body region 26 can be considered as having a base 34, with insulative material 22 being received thereagainst. An exemplary preferred thickness range for insulative material 22 beneath base 34 in but one implementation is from 500 Angstroms to 3,000 Angstroms.

Figure 5:
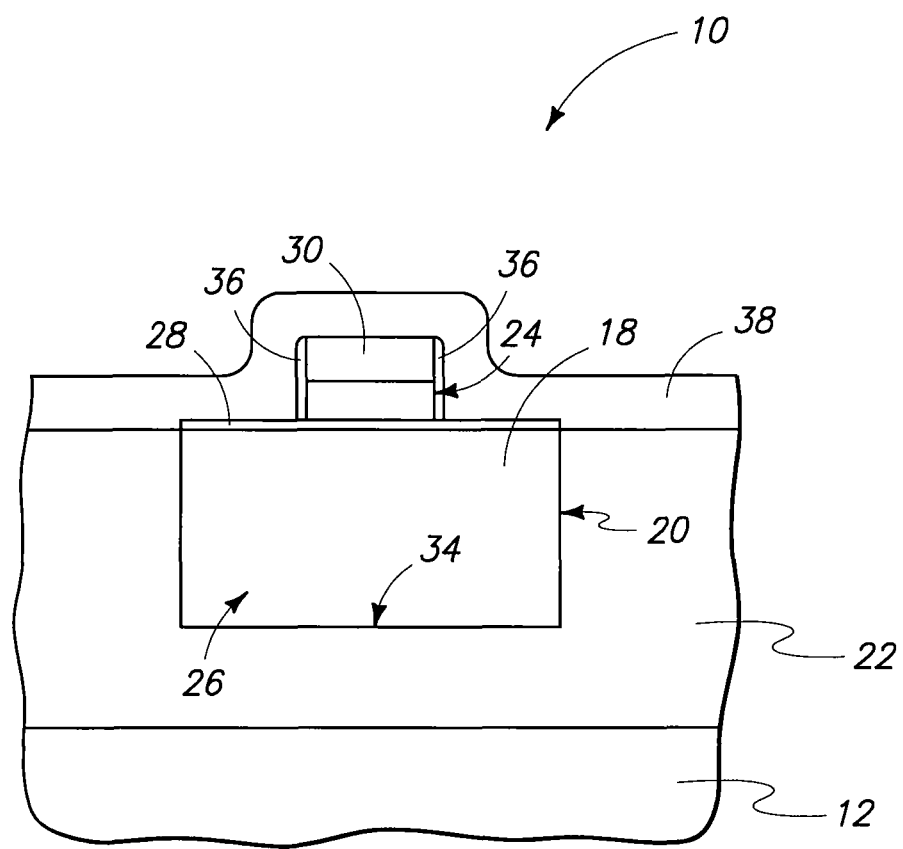
FIG. 5 is a view of the FIG. 4 substrate at a processing step subsequent to that shown by FIG. 4.

Referring to FIG. 5, insulative material 36 is formed over the sidewalls of word lines/gates 24. Such might be comprised of a single material, or one or more materials for example with each of the depicted regions 36 comprising two or more layers of different insulative materials. Exemplary preferred materials include silicon dioxide, silicon nitride, silicon oxynitride, hafnium dioxide, and/or aluminum oxide. An exemplary preferred thickness range for material 36 is from 50 Angstroms to 150 Angstroms. Such might be formed by thermal growth or deposition over the sidewalls of the material of word line 24, as one example. Alternately by way of example only, such might be formed by deposition and a subsequent maskless anisotropic spacer etch.

A conductive layer 38 has been formed over and spaced from word line 24, for example spaced therefrom by insulative/dielectric materials 30 and 36. Exemplary preferred materials for layer 38 include titanium nitride, polysilicon (p-type or n-type), aluminum, and cobalt silicide, with an exemplary preferred thickness range for layer 38 being from 50 Angstroms to 500 Angstroms.

Figure 6:
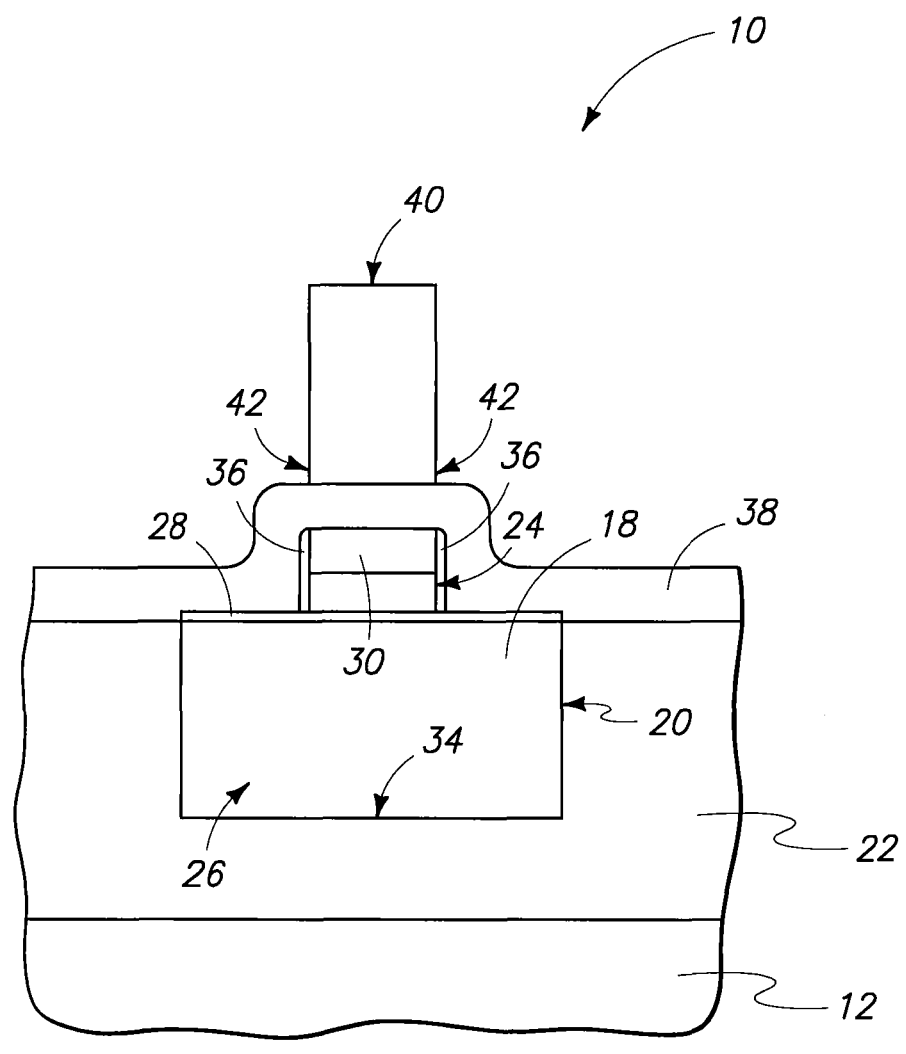
FIG. 6 is a view of the FIG. 5 substrate at a processing step subsequent to that shown by FIG. 5.

Referring to FIG. 6, a masking block 40 has been formed over conductive layer 38 and word line 24. By way of example only, a preferred material for masking block 40 includes photoresist. For purposes of the continuing discussion, masking block 40 can be considered as having spaced opposing lateral edges 42 at least proximate where block 40 is received relative to conductive layer 38.

Figure 7:
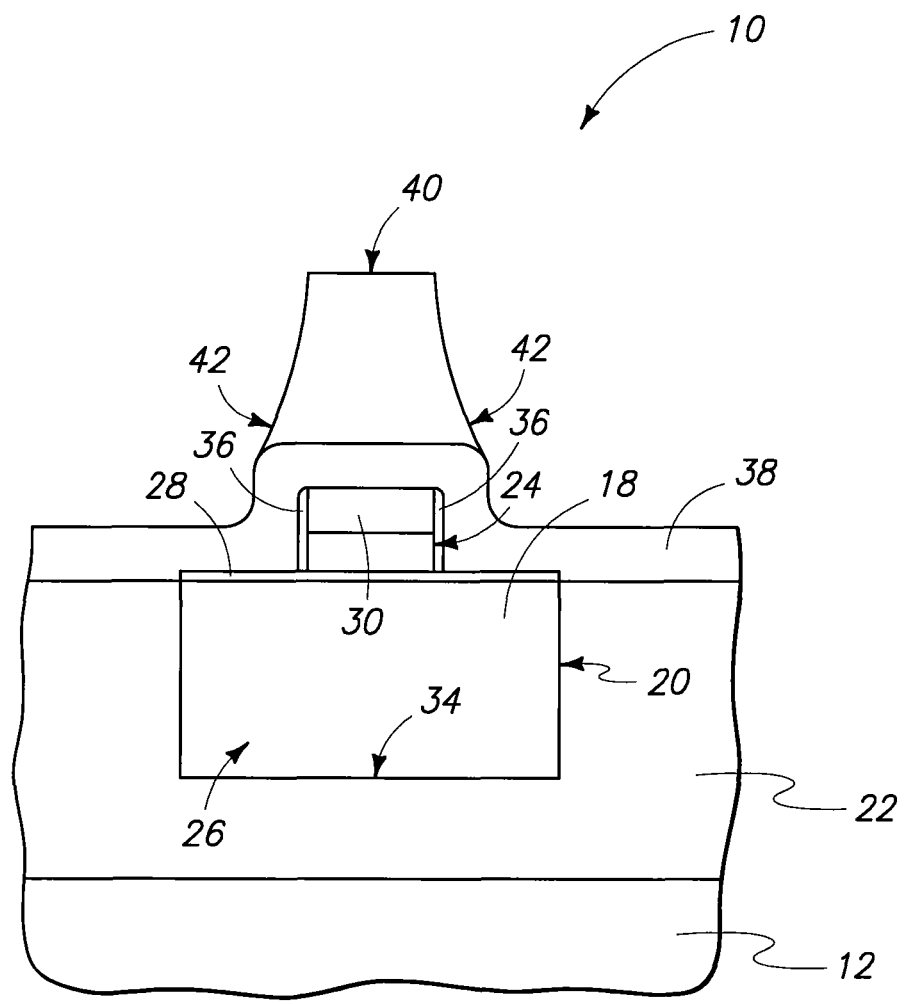
FIG. 7 is a view of the FIG. 6 substrate at a processing step subsequent to that shown by FIG. 6.

Referring to FIG. 7, masking block 40 has been heated effective to move opposing lateral edges 42 laterally outward further away from one another over conductive layer 38. An exemplary technique for doing so includes heating patterned photoresist masking block 40 at 150° C. to from one to three minutes. In the exemplary preferred embodiment, opposing lateral edges 42 are moved laterally outward a distance substantially equal to the lateral thickness of material 38 outwardly of the lateral extent of word line 24 where masking block 40 is patterned initially to substantially coincide with that of the pattern from which word line 24 and insulative capping material 30 thereover are patterned.

Figure 8:
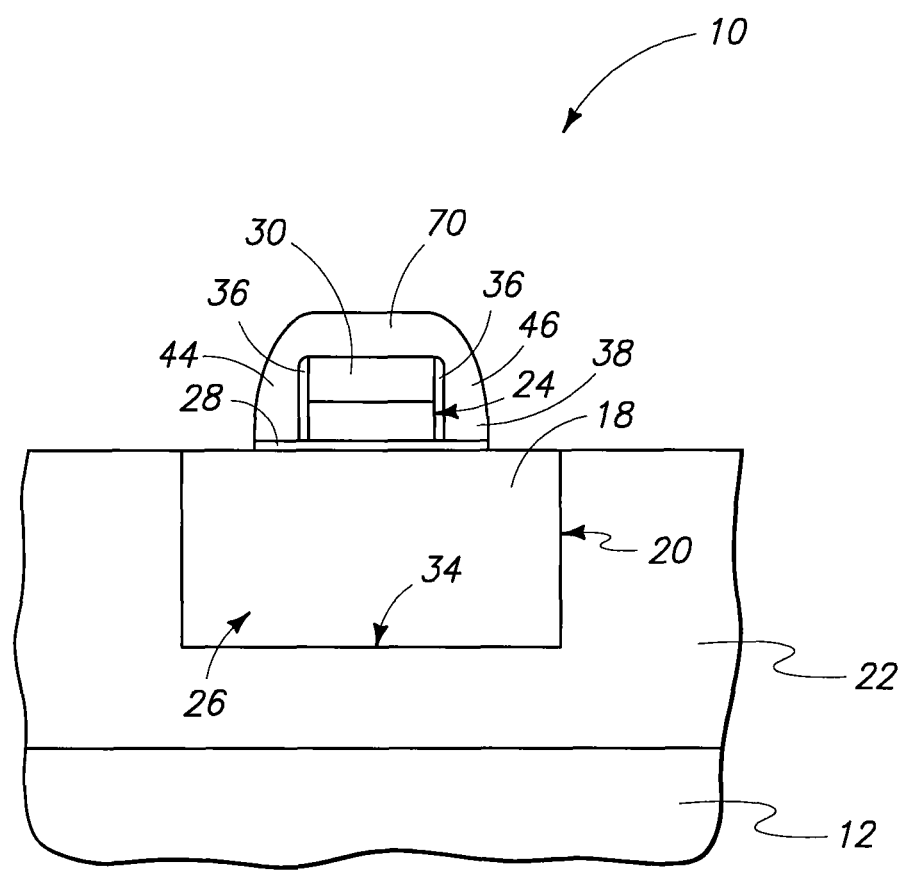
FIG. 8 is a view of the FIG. 7 substrate at a processing step subsequent to that shown by FIG. 7.
Figure 9:
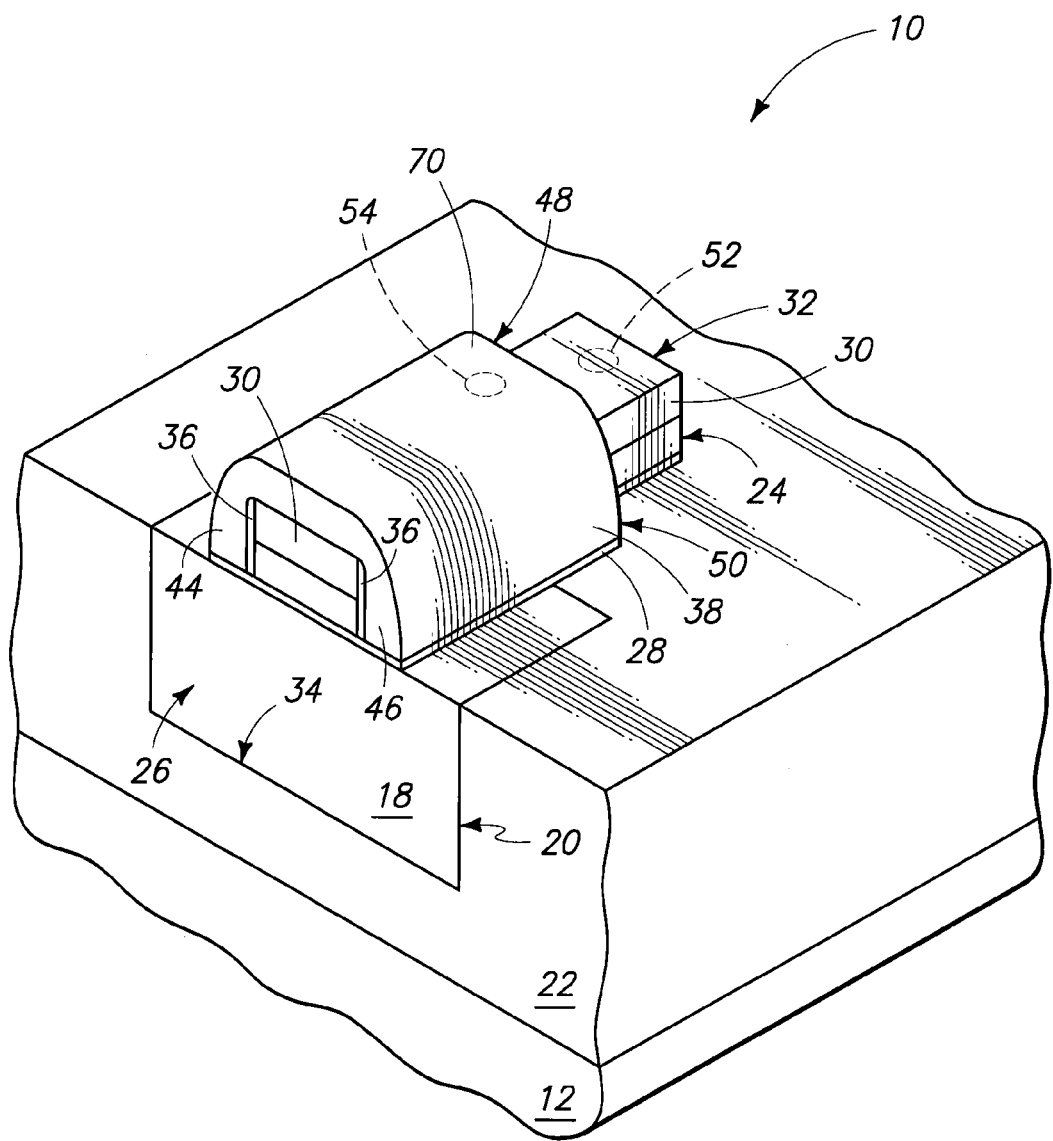
FIG. 9 is a diagrammatic perspective view of the FIG. 8 substrate.
Figure 10:
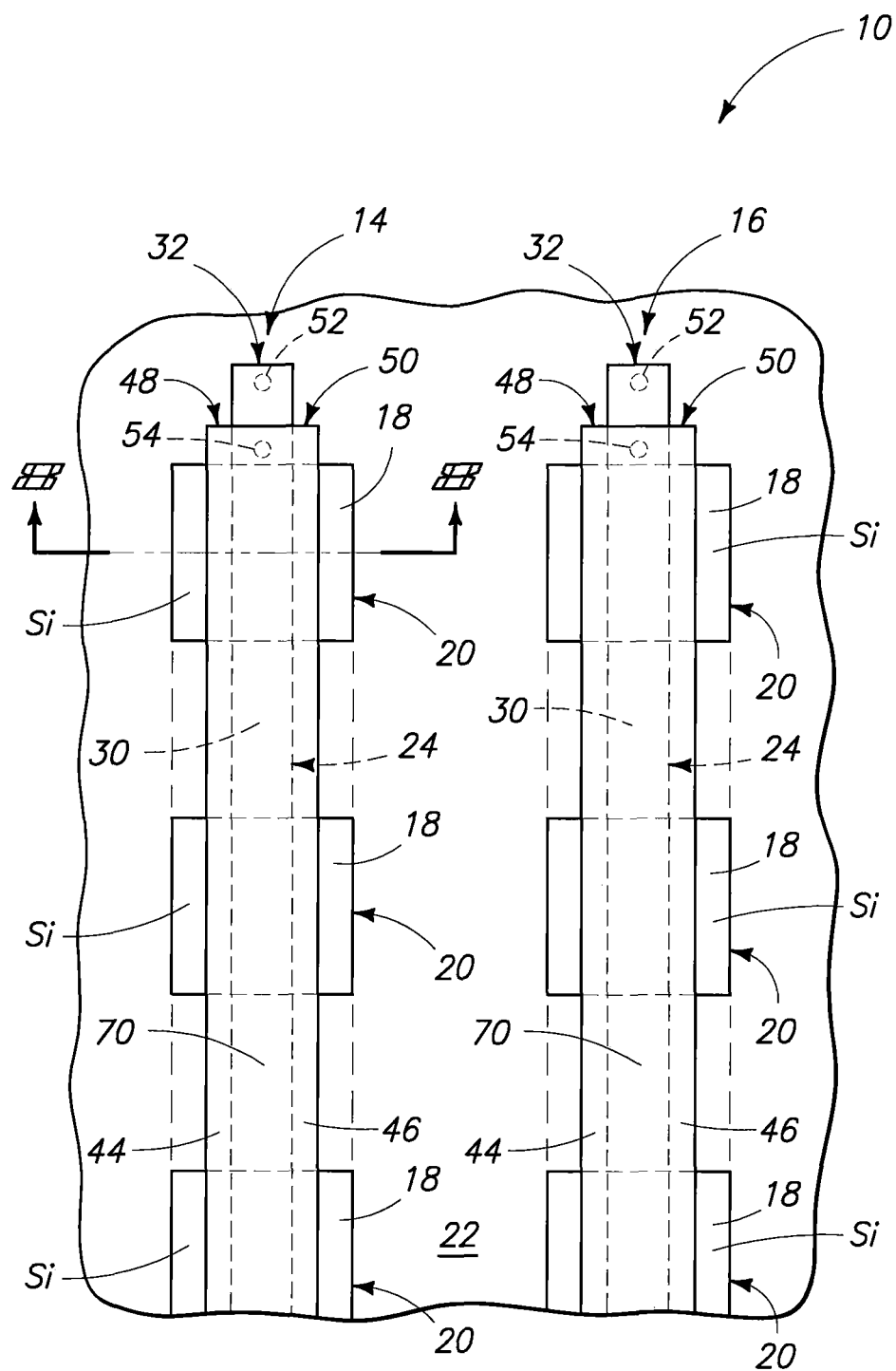
FIG. 10 is a diagrammatic top plan view of the FIGS. 8 and 9 substrate, with FIG. 8 being taken through line 8-8 in FIG. 10.

Referring to FIGS. 8-10, conductive layer 38 has been etched using masking block 40 (not shown) as a mask to form a pair of interconnected gate lines 44, 46 which are common to and extend over line 14 of spaced islands 20 along and laterally adjacent the opposing sides of word line 24, with pair of gate lines 44, 46 being received over respective floating body regions 26 of the respective spaced islands 20. Such provides but one exemplary preferred method of patterning a conductive layer 38 into a pair of gate lines which are common to and extend over the line of spaced islands along and laterally adjacent the opposing sides of the word line. For purposes of the continuing discussion, pair of gate lines 44, 46 can be considered as comprising respective ends 48, 50 proximate word line end 32. In one exemplary implementation, the patterning of layer 38 results in word line end 32 not being longitudinally co-located with either of gate line ends 48, 50, for example as shown. In one preferred implementation, the patterning of conductive layer 38 results in word line 24 extending longitudinally beyond respective ends 48, 50 of pair of gate lines 44, 46, for example as shown. Regardless, in one preferred implementation, the patterning forms pair of gate lines 44, 46 to be shorter in length than the length of word line 24.

Referring to FIGS. 9 and 10, a first conductive contact 52 is formed to word line 24, and a second conductive contact 54 is formed to pair of gate lines 44, 46. Accordingly different first and second conductive contacts are associated with the respective gate lines 44, 46 and word line 24 in a most preferred embodiment so that such can be separately controlled as recognized by people of skill in the art, and for example as described below. Contacts 52 and 54 are only diagrammatically indicated with dashed circles in FIGS. 9 and 10 as such would likely be formed to the exemplary depicted locations through subsequently deposited dielectric material (not shown for clarity in the drawings.) In one exemplary preferred implementation, first conductive contact 52 is formed to some portion of word line 24 extending longitudinally beyond respective ends 48, 50 of pair of gate lines 44, 46, for example as shown.

Figure 11:
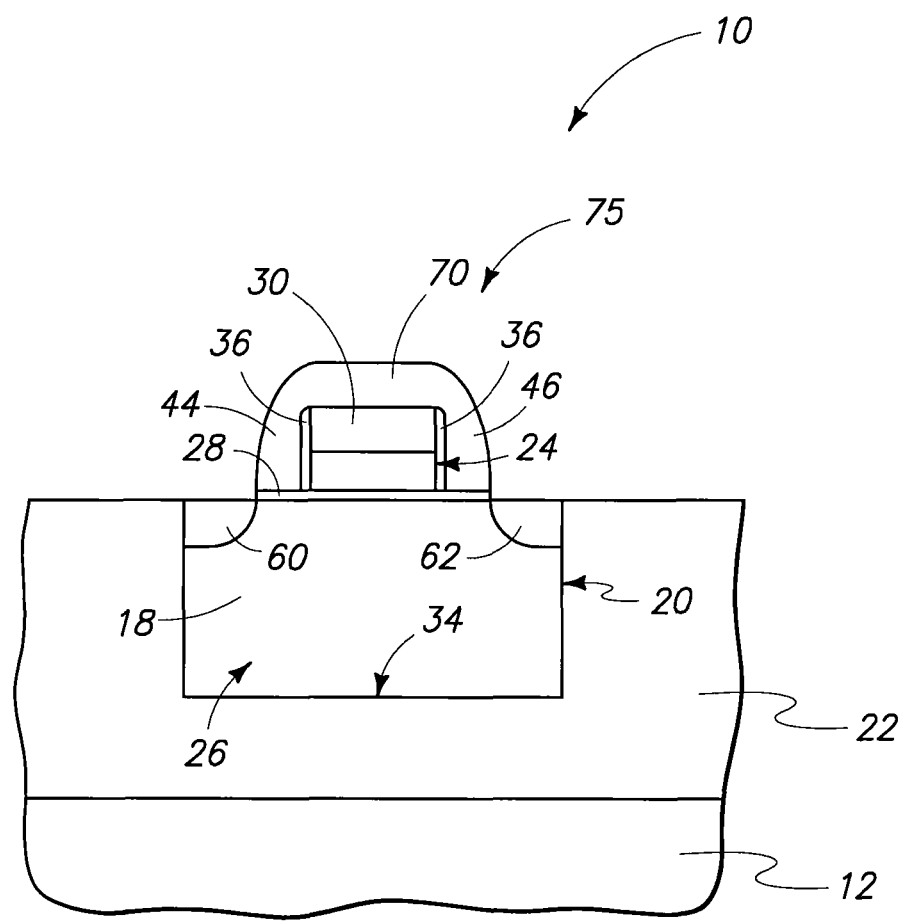
FIG. 11 is a view of the FIG. 8 substrate at a processing step subsequent to that shown by FIG. 8.

Referring to FIG. 11, respective pairs of spaced source/drain regions 60, 62 are formed within semiconductive material 18 of islands 20 laterally outward of interconnected pair of gate lines 44, 46. Accordingly, typically and preferably, such source/drain regions are formed after the patterning of conductive layer 38. Regardless, FIG. 11 depicts an exemplary fabricated capacitorless one transistor DRAM cell 75.

In one aspect, the invention contemplates a capacitorless one transistor DRAM cell independent of the method of manufacture, and independent of whether a plurality of such DRAM cells are fabricated, although fabricating a plurality of such is preferred and would be typical. Such a DRAM cell comprises a pair of spaced source/drain regions received within semiconductive material. The above-described regions 60, 62 and formed within exemplary islands 20 of semiconductive material 18 are but exemplary constructions. An electrically floating body region is disposed between the source/drain regions within the semiconductive material. Further by way of example only, the exemplary cell is depicted as not being fully depleted, with semiconductive material directly beneath source/drain regions 60, 62 also comprising electrically floating body region/material.

A first gate is spaced apart from and capacitively coupled to the body region between the source/drain regions. That portion of word line 24 received over an individual island 20 is but one exemplary such first gate. A pair of opposing conductively interconnected second gates is spaced from and received laterally outward of the first gate. The second gates are spaced from and capacitively coupled to the body region laterally outward of the first gate and between the pair of source/drain regions. By way of example only, second gates 44, 46 constitute an exemplary pair of such second gates. In one depicted and preferred implementation, second gates 44, 46 are conductively interconnected to one another by conductive material (i.e., a conductive material region 70) extending elevationally over first gate 24 between pair of second gates 44, 46. Pair of second gates 44, 46 might be conductively interconnected by another manner, for example and by way of example only by a separate conductive layer formed over initially isolated second gates 44, 46. In such instance, such conductive layer might be the same or different from that of material or materials from which gates 44, 46 are made. Further of course, gates 44 and 46 do not need to be of the same composition, but are preferably.

In one preferred implementation, a capacitorless one transistor DRAM cell comprises a substrate comprising an island of semiconductive material. Insulative material is received laterally about and beneath the island and contacts semiconductive material of the island. A pair of spaced source/drain regions is received within the island semiconductive material. An electrically floating body region is disposed between the source/drain regions within the island semiconductive material. A first gate is spaced apart from and capacitively coupled to the island body region between the island's source/drain regions. A pair of conductive second gates is spaced from and received laterally outward of the first gates, with the second gates being spaced from and capacitively coupled to the body region laterally outward of the first gate and between the pair of source/drain regions. Such might be encompassed in any of the above-described methods and structures.

Figure 12:
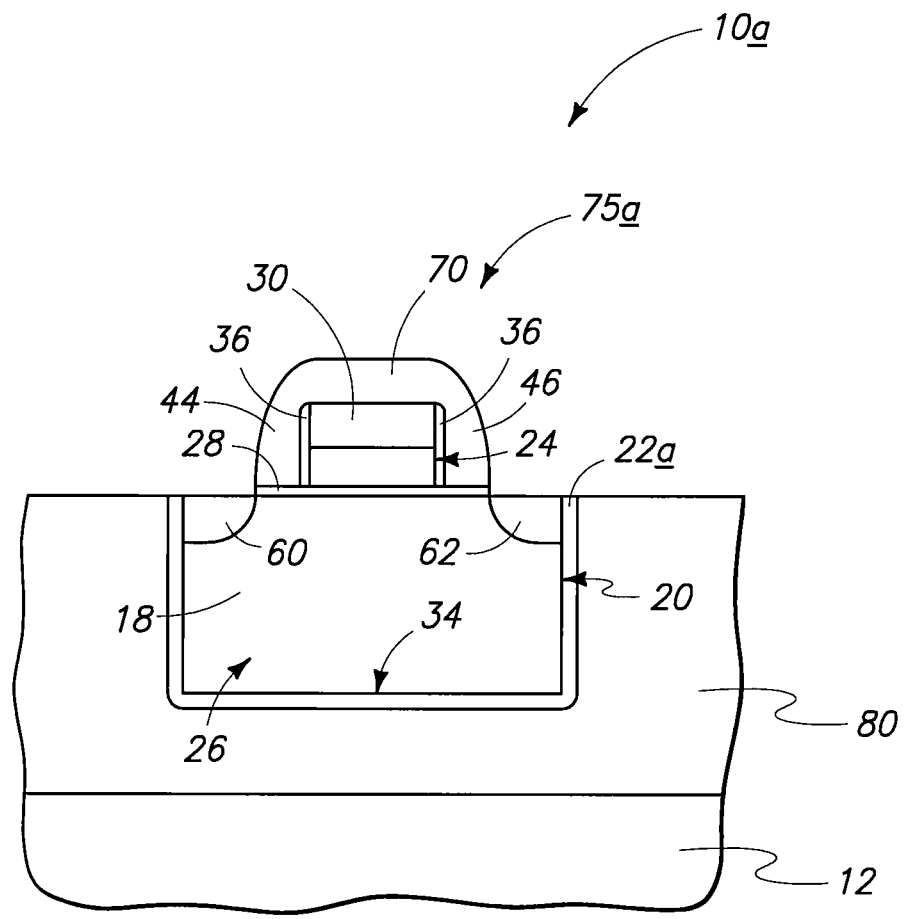
FIG. 12 is a diagrammatic sectional view of an alternate embodiment substrate to that of FIG. 11.

FIG. 12 depicts an exemplary additional implementation and embodiment alternate and corresponding to that of FIG. 11. Like numerals from the first-described embodiment have been utilized where appropriate, with differences being indicated with the suffix "a" or with different numerals. In FIG. 12, insulative material 22a is preferably received laterally about and beneath respective islands 20 and contacts semiconductive material 18 of such islands. Conductively doped semiconductive material 80 is received laterally about and beneath respective islands 20 outwardly of insulative material 22a. Exemplary preferred material 80 is conductively doped p-type or n-type polycrystalline silicon. Preferably, insulative material 22a has a thickness no greater than 200 Angstroms both beneath island 20 and intermediate the lateral sidewalls of island 20 and conductively doped semiconductive material 80. A more preferred such thickness range for material 22a is from 50 Angstroms to 150 Angstroms. The construction of FIG. 12 might, of course, be fabricated by any existing or yet-to-be developed methods.

People of skill in the art will appreciate and develop various operational voltages for writing, reading, refreshing, and/or holding data within the above-depicted exemplary DRAM cell, and in integrated circuitry comprising an array of such DRAM cells. By way of example only, the below chart depicts exemplary operating voltages, where $V_i$ is the first gate voltage, $V_{cs}$ (conductive spacers) are voltages for the pair of second gates, $V_t$ is the threshold voltage, $V_S$ is the source voltage, and $V_D$ is the drain voltage. Further by way of example only where conductive surrounding semiconductive material 80 in the FIG. 12 embodiment is utilized, such would preferably be maintained constant at some suitable exemplary fixed voltage of −3V to −10V. A preferred, non-limiting, reason for utilizing surround conductively doped semiconductive material 80 is to establish and maintain the same potential of both sides of preferred poly of the transistor so that charge collects at the walls of the structure by the dielectric capacitance.

Exemplary Operating Voltages

|  | $V_i$ | $V_{cs}$ | $V_t$ | $V_D$ | $V_S$ |
|---|---|---|---|---|---|
| Write | −3 V to −10 V | −2.5 V | High | 1.8 V/0 V | Float/0 V |
| Hold Data | −3 V to −10 V | 0 V | High | Float/Float | Float/0 V |
| Read | 2.5 V | 2.5 V | 0.5 V | 0.1 V/0.1 V | 0 V/0 V |
| Re-Write | −3 V to −10 V | −2.5 V | High | 1.8 V/0 V | Float/0 V |
| Hold Data | −3 V to −10 V | 0 V | High | Float/Float | Float/0 V |

Exemplary techniques and construction for the operation of capacitorless one transistor DRAM cells are disclosed, by way of example, in U.S. Pat. No. 6,969,662; U.S. Patent Application Publication Nos. 2005/0017240 and 2005/0063224; Kuo et al., "A Capacitorless Double-Gate DRAM Gate Cell Design For High Density Applications", IEDM, IEEE 2002, pp. 843-846 and Yoshida et al., "A Capacitorless 1 T-DRAM Technology Using Gate-Induced Drain-Leakage (GIDL) Current For Low-Power And High-Speed Embedded Memory", IEEE Transactions on Electron Devices, Vol. 53, No. 4, April 2006, pp. 692-697. The disclosures of U.S. Pat. Nos. 5,714,786; 6,005,273; 6,090,693; and 7,005,710 are herein incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A transistor structure, comprising:
   a pair of spaced source/drain regions within semiconductive material;
   an electrically floating body region within the semiconductive material; the floating body region having a base, an insulative material being against the base, conductively doped semiconductive material being against the insulative material beneath the base;
   a first gate spaced apart from and capacitively coupled to the body region between the source/drain regions; and
   a pair of opposing conductively interconnected second gates spaced and electrically isolated from the first gate, the pair of second gates being laterally outward of the first gate, the second gates being spaced from and capacitively coupled to the body region laterally outward of the first gate and capacitively coupled to the body region between the pair of source/drain regions.

2. The structure of claim 1 wherein the pair of second gates is conductively interconnected by conductive material extending elevationally over the first gate between the pair of second gates.

3. The structure of claim 1 wherein the first gate is separated from the second gates by at least two insulative materials.

4. A transistor structure, comprising:
a substrate comprising an island of semiconductive material;
insulative material around and underneath the island and contacting semiconductive material of the island;
a pair of spaced source/drain regions within the island of semiconductive material;
an electrically floating body region within the island of semiconductive material;
a first gate spaced apart from and capacitively coupled to the island floating body region at least partially between the island source/drain regions; and
a pair of conductive second gates spaced from and laterally outward of the first gate, the second gates being spaced from and capacitively coupled to the island floating body region laterally outward of the first gate and at least partially between the pair of source/drain regions.

5. The structure of claim 4 comprising conductively doped semiconductive material around and underneath the island outwardly of the insulative material.

6. Integrated circuitry comprising an array of transistor structures, comprising:
a series of spaced islands of semiconductive material within a substrate; and
individual transistor structures associates with individual of the spaced islands, the individual transistor structures individually comprising:
a pair of source/drain regions within the semiconductive material of the respective island;
an electrically floating body region within the semiconductive material of the respective island;
a first gate comprised of a gate line which is common to and extends over the series of spaced islands at least partially between the respective pairs of source/drain regions, the first gate line having lateral sides and being spaced apart from and capacitively coupled to the respective body regions of the respective islands; and
a pair of opposing conductively interconnected second gates spaced from the first gate and being laterally outward of the gate line, the second gates being spaced from and capacitively coupled to the respective body regions laterally outward of the respective first gates and at least partially between the respective pairs of source/drain regions of the respective islands, the pairs of opposing interconnected second gates comprising a conductive line which is common to the series of spaced islands and extends above and to the lateral sides of the gate line.

7. The integrated circuitry of claim 6 comprising a first conductive contact connected to the gate line and a different second conductive contact connected to the conductive line.

8. The integrated circuitry of claim 6 wherein the gate line is longer in length than the conductive line.

9. The integrated circuitry of claim 6 comprising insulative material around and underneath the respective islands and contacting semiconductive material of the respective islands; and
conductively doped semiconductive material around and underneath the respective islands outwardly of the insulative material.

10. The integrated circuitry of claim 6 wherein the conductive line has an end and the gate line has an end proximate the conductive line end, said gate line end and said conductive line end not being longitudinally co-located.

11. The integrated circuitry of claim 10 wherein the gate line is longer in length than the conductive line.

12. The integrated circuitry of claim 10 wherein the gate line end is longitudinally outward of the conductive line end.

13. The integrated circuitry of claim 12 wherein the gate line is longer in length than the conductive line.

14. A transistor structure, comprising:
a pair of spaced source/drain regions within semiconductive material;
an electrically floating body region within the semiconductive material;
a first gate spaced apart from and capacitively coupled to the body region between the source/drain regions;
a pair of opposing conductively interconnected second gates spaced and electrically isolated from the first gate, the pair of second gates being laterally outward of the first gate, the second gates being spaced from and capacitively coupled to the body region laterally outward of the first gate and capacitively coupled to the body region between the pair of source/drain regions, the second gates having respective laterally outermost edges, the second gates being conductively interconnected by conductive material extending elevationally over the first gate between the pair of second gates; and
gate dielectric material between the first gate and the body region and between the second gates and the body region, the gate dielectric material having opposing laterally outermost edges which are laterally co-located with those of the respective second gates.

15. Integrated circuitry comprising an array of transistor structures, comprising:
a series of individual transistor structures individually comprising:
a pair of source/drain regions within semiconductive material;
an electrically floating body region within the semiconductive material;
a first gate comprised of a gate line which is common to and extends over the semiconductive material of the series at least partially between the respective pairs of source/drain regions, the first gate line having lateral sides and being spaced apart from and capacitively coupled to the respective body regions; and
a pair of opposing conductively interconnected second gates spaced from the first gate and being laterally outward of the gate line, the second gates being spaced from and capacitively coupled to the respective body regions laterally outward of the respective first gates and at least partially between the respective pairs of source/drain regions, the pairs of opposing interconnected second gates comprising a conductive line which is common to the series and extends above and to the lateral sides of the gate line; and
the gate line being longer in length than the conductive line.

16. The integrated circuitry of claim 15 comprising insulative material underneath and contacting the semiconductive material; and
conductively doped semiconductive material underneath and contacting the insulative material.

17. Integrated circuitry comprising an array of transistor structures, comprising:
a series of individual transistor structures individually comprising:
a pair of source/drain regions within semiconductive material;
an electrically floating body region within the semiconductive material;
a first gate comprised of a gate line which is common to and extends over the semiconductive material of the series at least partially between the respective pairs of source/drain regions, the first gate line having lateral sides and being spaced apart from and capacitively coupled to the respective body regions; and
a pair of opposing conductively interconnected second gates spaced from the first gate and being laterally outward of the gate line, the second gates being spaced from and capacitively coupled to the respective body regions laterally outward of the respective first gates and at least partially between the respective pairs of source/drain regions, the pairs of opposing interconnected second gates comprising a conductive line which is common to the series and extends above and to the lateral sides of the gate line; and
the conductive line having an end and the gate line having an end proximate the conductive line end, said gate line end and said conductive line end not being longitudinally co-located.

18. The integrated circuitry of claim 17 wherein the gate line is longer in length than the conductive line.

19. The integrated circuitry of claim 17 comprising insulative material underneath and contacting the semiconductive material; and
conductively doped semiconductive material underneath and contacting the insulative material.

20. The integrated circuitry of claim 17 wherein the gate line end is longitudinally outward of the conductive line end.

21. The integrated circuitry of claim 20 wherein the gate line is longer in length than the conductive line.

22. A transistor structure, comprising:
a pair of spaced source/drain regions within semiconductive material;
an electrically floating body region within the semiconductive material;
a first gate spaced apart from and capacitively coupled to the body region between the source/drain regions;
a pair of opposing conductively interconnected second gates spaced and electrically isolated from the first gate, the pair of second gates being laterally outward of the first gate, the second gates being spaced from and capacitively coupled to the body region laterally outward of the first gate and capacitively coupled to the body region between the pair of source/drain regions, the second gates having respective laterally outermost edges, the second gates individually comprising an arcuate laterally outer surface that joins with its respective laterally outermost edge; and
gate dielectric material between the first gate and the body region and between the second gates and the body region, the gate dielectric material having opposing laterally outermost edges which are laterally co-located with those of the respective second gates.

23. The structure of claim 22 wherein the pair of second gates is conductively interconnected by conductive material extending elevationally over the first gate between the pair of second gates.

* * * * *